United States Patent [19]
Ryan et al.

[11] Patent Number: 4,826,709
[45] Date of Patent: May 2, 1989

[54] DEVICES INVOLVING SILICON GLASSES

[75] Inventors: Vivian W. Ryan, Nutley; Gerald Smolinsky, Madison, both of N.J.

[73] Assignee: American Telephone and Telegraph Company AT&T Bell Laboratories, Murray Hill, N.J.

[21] Appl. No.: 161,876

[22] Filed: Feb. 29, 1988

[51] Int. Cl.[4] .............................................. B05D 3/12
[52] U.S. Cl. .................... 427/240; 437/238; 437/231
[58] Field of Search ............... 437/238, 231; 427/240, 427/387

[56] References Cited

U.S. PATENT DOCUMENTS 4,652,467  3/1987  Brinker ............................ 437/238
4,719,125  1/1988  Anillo ............................. 437/238

FOREIGN PATENT DOCUMENTS 0215076  12/1983  Japan ............................. 437/231
0254736  12/1985  Japan ............................. 437/231
0139033   6/1986  Japan ............................. 437/238

Primary Examiner—Sam Silverberg
Attorney, Agent, or Firm—Bruce S. Schneider

[57] ABSTRACT

A sol-gel process is utilized for producing silicon oxide glasses useful in the manufacture of devices such as semiconductor devices. These glasses are easily deposited by techniques such as spinning. Not only is the glass easily applied, but also has advantageous electrical, etching, and mechanical properties. Thus, these glasses are useful in applications such as passivating layers for integrated circuit devices and as intermediary layers in trilevel lithography for the production of such devices.

13 Claims, 2 Drawing Sheets

DEVICES INVOLVING SILICON GLASSES

BACKGROUND OF THE INVENTION

1. Technical Field

This invention relates to devices, and in particular, to devices produced utilizing a silicon oxide glass layer.

2. Art Background

Silicon oxide glass layes, e.g., silicon dioxide layers, are frequently utilized in the fabrication of devices such as semiconductor devices. For example, in the fabrication of VLSI semiconductor devices silicon dioxide layers are used as a cap layer for passivation, as a dielectric between two conductors, and as a dielectric to isolate active regions on wafer surfaces.

Not only are silicon oxide glass layers utilized as an integral part of the device strucutre but such layers are also utilized during fabrication and then removed. For example, devices are processed by forming a mask pattern on the upper surface of the device substrate. The mask is formed to have opening that expose underlying device regions to be processed. These masks are typically formed by depositing a resist material, delineating this resist material to have suitable openings, and then performing the required processing.

As device structures become smaller, multilevel resists have been contemplated to achieve the more demanding resolution (See U.S. Pat. No. 4,244,799 dated Jan. 13, 1981 issued to Fraser, Maydan and Moran.) In these configurations, a lower planarizing layer is deposited to provide a relatively planar surface for subsequent resist layers. An intermediary layer is then formed that is resistant to an oxygen reactive ion etching (RIE) process. A final layer is deposited and delineated into the desired patterns. This delineation exposes the intermediary layer which is then fluorine-RIE etched in the configuration defined by the overlying layer. The delineated intermediary layer is, in turn, used as a mask for and oxygen-RIE etch that removes the exposed regions of the underlying layer but does not effect the intermediary layer and thus does not degrade the pattern transfer. The completely processed resist is then utilized for subsequent fabrication procedures.

Generally, silicon oxide glass layers such as the intermediary silicon oxide layer in a multilevel resist, or a silicon oxide glass layer in the device are formed utilizing procedures such as thermal oxidation, sputter deposition, chemical vapor deposition, plasma-enhanced chemical vapor deposition or photo-enhanced chemical vapor deposition. These procedures are capable of producing suitable glass layers, e.g., silicon dioxide layers with dielectric constants less than 6, breakdown voltages greater than 4 MV/cm, leakage currents less than $10^{-12}$ amps/cm$^2$ at 1 MV, and mechanical stresses on silicon of less than $10^{10}$ dynes/cm$^2$. However, these techniques are relatively costly, produce nearly conformal coatings, and require relatively high processing temperatures, e.g., temperatures about 300 degrees Centrigrade. At processing temperatures greater than 300 degrees Centigrade, undesirable hillock growth is observed on aluminum sputter deposited at 300 degrees Centigrade. (Hillocks are aluminum extrusions as big as or bigger than the design rule of the device.)

Various methods have been suggested for reducing costs associated with silicon oxide glass-layer formations and for producing a relatively planar layer at low temperatures. One proposal involves depositing a silicon-rich glass layer by a spinning technique. Typically, these layers (generally denominated spin-on glasses) are polysiloxanes, i.e., compositions having a high fraction, up to 50 percent, of carbon-silicon bonds. These polymers are dissolved in a suitable solvent spun onto a substrate and then after solvent evaporation and curing (possibly including crosslinking) form a polymer matrix containing silicon in a concentration generally between 15 and 40 weight percent.

Although these spin-on materials are relatively easy to form, their properties have not always been entirely satisfactory. For example, generally the resulting films are porous and thus allow rapid transfer of impurities to the underlying layers. Additionally, these materials at typical processing temperatures outgas substantially, have a breakdown voltage often less than 4 MV/cm, and are not sufficiently resistant to some common fabrication processes, e.g., wet etching with solutions such as aqueous HF.

SUMMARY OF THE INVENTION

A layer composed essentially entirely of silicon and oxygen is producible by a spin-on technique utilizing a specific fabrication procedure. In particular, a salicic acid is formed by in situ reaction, for example, by introducing a material such as silicon(IV) acetate into a suitable solvent, e.g., ethanol, n-propanol or n-butanol. The resulting reaction yields salicic acid, acetic acid, water plus a liquid with a relatively high vapor pressure—in the previous example ethyl, propyl or butyl acetate. The salicic acid then polymerizes at a sufficient polymerization rate to produce a sol that has a relatively long shelf life at room temperature, i.e., does not significantly increase viscosity (an increase of 20 percent over that for the solvent) for periods of at least 3–5 days for 4-weightpercent silicon cencentrations with increasingly longer shelf life for lower concentrations. This sol is then spun onto the desired substrate, e.g., onto a lower resist layer or onto an electronic device and cured to form the desired siliconoxide layer.

The layers resulting from this procedure after curing are essentially entirely silicon and oxygen and have excellent properites: dielectric constant as low as 4.5, breakdown voltages greater than 5 MV/cm, leakage currents of $10^{11}$ amps at 1 MV/cm and, mechanical tensile stresses as low as $5 \times 10^8$ dynes/cm$^2$. After an initial cure at 400 degrees Centigrade, the materials essentially do not outgas at temperatures as high as 900 degrees Centigrade, are resistant to wet etchants and do not appear porous in an SEM having a magnification of 10,000 times. (At TEM magnifications of 127,000 some porosity is observed.) Additionally, the materials are significantly more oxygen plasma resistant than previous spin-on glass materials and are compositionally very similar to thermally grown oxides. Thus, they are especially useful for multilevel resist applications.

DETAILED DESCRIPTION

Figure 1:
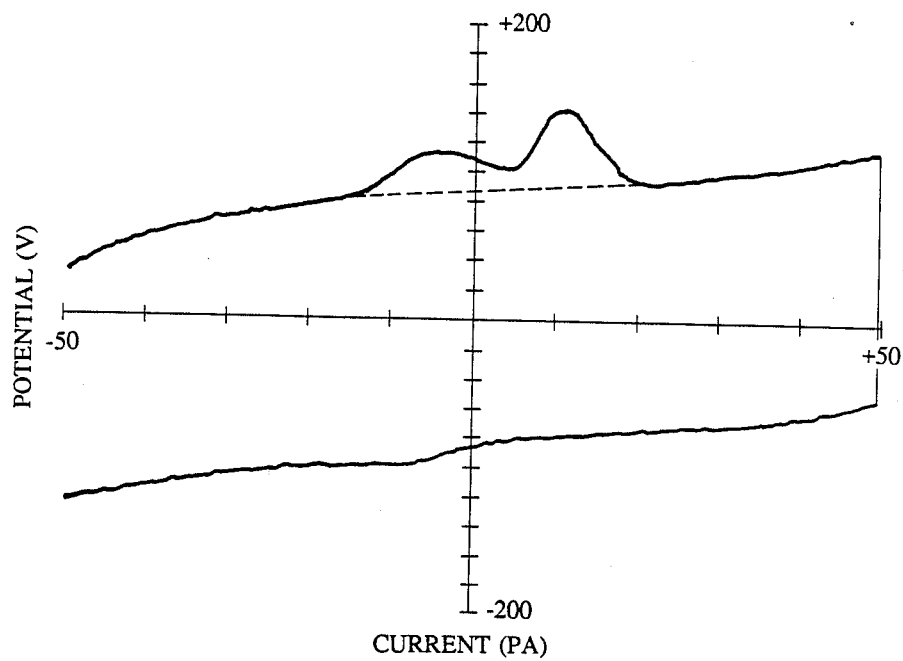
FIGS. 1–4 are illustrative of results obtained with the invention.

To produce the desired spin-on-silicon oxide, a sol is formed and the sol is spun onto a substrate to form a gel. In this procedure a solution of salicic acid is first formed by in situ reaction. Upon formation, the salicic acid begins to polymerize. (For purposes of this disclosure this polymerization is considered part of the reaction.)

If the polymerization leading to sol growth is too rapid, premature gelling occurs, while if the polymerization is too slow, sol formation is retarded. Generally, it is possible to monitor the polymerization and aggregation rates by observing the change in the optical scattering by the sol. Appropriate sol particle size, particle shape and particle density are obtained when the differential light scattering pattern using an incident beam with a wavelength of 365 nm indicates a fit with at least a 0.95 correlation coefficient between the measured data and the theoretical curve predicted for spherical scatterers by P. Debye and E. W. Anacker, "Micelle Shape from Disymmetry Measurements", *Journal of Physical Chemistry*, 55, 644, 1951, and where the mass average particle diameter as calculated from this fit is greater than 450 Angstroms. Thus, to obtain an appropriate sol with a suitable shelf life and a subsequent gel leading to desirable properties in the ultimate spin-on-silicon oxide material, the reaction should be confined and the reactants chosen to yield a light scattering pattern in this desired range.

Both the in situ formation conditions and the composition present upon formation affect the subsequent rate of sol formation. Thus, to obtain the desired sol properties, the reactants employed to form the salicic acid, the composition of the salicic acid reaction mixture, and the reaction conditions should be controlled. For example, the reactants utilized to produce the salicic acid generally result in a highly exothermic reaction. If the sol growth is too rapid, ultimate film properties are degraded. Thus, typically, the temperature of the reaction mixture during the formation of the salicic acid should be controlled.

The reactants also affect the polymerization rate. Typically, a silicon(IV) anhydride reactant such as silicon(IV) acetate or silicon(IV) propionate is employed. When reactants with larger carbon moieties bound to the silicon atoms are employed, sol growth unacceptably changes. Thus, it is generally desirable to utilize lower organic acid moieties (typically less than 4 carbon atoms) bound to the silicon atom as the reactant composition. These materials are then reacted with a source of alcohol such as a lower alcohol, e.g., ethanol, n-propanol or n-butanol to produce the salicic acid. (It is desirable to distill the alcohol(s) in a quartz vessel to remove, for example, metals such as sodium moieties.) Typically, larger molecules, e.g., higher alcohols such as pentanol, are not desirable since sol growth is too rapid and the ultimate spin-on silicon oxide layer has increasingly degraded electrical and mechanical properties. Generally, the concentration of the silicon-containing reactant should be maintained at such a level so that the final silicon content is less than 10 weight percent. Higher concentrations lead to rapid, premature gelling.

The initial reaction typically produces salicic acid in a liquid medium. It is desirable to choose the reactants to produce water and/or a liquid having a relatively high vapor pressure and therefore a low boiling point, i.e., a boiling point below 146 degrees Centigrade. In the case of a silicon (IV) acetate reaction with propanol, propyl acetate and acetic acid are formed. Upon spin applications the solvents essentially completely evaporate from the gel. Subsequent heating to approximately 400 degrees Centigrade removes any remaining solvent.

The amount of water present with the salicic acid affects the sol growth. After reaction begins, e.g., reaction of silicon (IV) acetate with propanol, it is possible to add some water to the water formed by the reaction to accelerate the growth of the sol. Typically, approximately 1 molar equivalent of water is added 24 hours after salicic acid formation to produce a desirable sol-growth acceleration. The addition of an appropriate aliquot of water is not essential but substantially increases the rate of sol formation and to an extent improves the ultimate properties obtained. (If water is added after initiation of the reaction in the above exemplary preparation, the growth period of the sol is approximately one-half as long, and the film obtained from such a suspension has a higher resistance to aqueous HF compared to the film obtained from a suspension with no water addition.) Although when ethanol is employed, the addition of water increases the polymerization rate, this rate is still relatively slow. For ethanol the addition of aqueous HF (49 weight percent) augments polymerization so that the solution is usable after about 24 hours. Without the presence of fluorine the polymerization rate is slower and depends on the silicon concentration. For example, at 6 weight percent silicon the sol is ready in approximately 7 to 10 days. (The usable life in the case of HF addition at a concentration of 3 weight percent silicon, is 10 hours or less.) The HF also suppresses Si-OH content. However, the addition of HF does not improve electrical properties and possibly slightly degrades these properties. Addition of aqueous HF to reactions employing propanol or butanol typically produces an unacceptably high polymerization rate. Addition of $B_2O_3$ like HF also increases the polymerization rate. In general, films produced using only ethanol are tensile stressed and tend to crack when thicker than 1500 Angstroms. Mixtures of alcohols are not precluded to, for example, adjust polymerization rates and electrical properties.

It is desirable to maintain the silicon content of the ultimate solution utilized for spinning to less than 4 weight percent. A higher concentration produces premature gelling and solidification during spinning. Lower concentrations for some applications are desirable because they yield longer shelf life and the ability to fill the bottom corners of features with relatively high aspect ratios, i.e., greater than 1 for features with dimensions less than 1 $\mu$m wide. (Aspect ratio is the height of the feature divided by the spacing between features.) The precise concentration utilized determines the thickness of the layer ultimately formed for a given spin speed. Generally, for layer thicknesses in the range 0.1 to 0.21 $\mu$m a concentration in the range 3 to 4 weight percent silicon is employed. A controlled sample is utilized to determine the precise concentration required for a particular desired thickness.

Spinning is accomplished by placing at least 0.5 mL of the sol solution on the center of the substrate to be coated and then spinning the substrate at a rate in the range 3000 to 5000 rpm. (These ranges are appropriate for a 4-inch wafer and should be adjusted for deviations from this size.) Lower spinning speeds generally lead to striated films while higher spinning speeds lead to thinner films. After spinning, it is desirable to heat the spun-on-silicon oxide to remove any remaining solvent and residual volatile by-products. Generally, temperatures in the range 80 to 250 degrees Centigrade are suitable for this heating step. The heating time depends on the thickness of the layer. Typically, layer thicknesses for resist applications are in the range of 0.08 to 0.2 $\mu$m and require a heating time of 1 to 15 minutes. Thicknesses for device applications are generally in the range of 0.1 to 0.5 μm and require a heating period in the range 1 to 15 minutes. Curing is performed at temperatures of at least 250 degrees Centigrade for resist applications and at least 350 degrees Centigrade for device applications. Typical curing times in a convection oven are 1 to 20 minutes for 250 degrees Centigrade curing and 0.5 hour to 18 hours for 350 degrees Centigrade. The upper curing temperature limit is not critical provided the substrate is not degraded. Generally, temperatures of 800 to 1000 degrees Centigrade are employed when no metals are present.

After the dieletric layer is formed conventional device fabrication procedures are possible. For example, the layer is patterned using lithography together with a reactive ion etching process under conditions suitable for silicon dioxide. It is possible to metallize the dielectric and then pattern the metal layer through conventional lithography and etching techniques. It is also possible to use the dielectric layer for other purposes such as for planarization through etch back. It is possible to apply the sol to a variety of materials such as metals, other dielectrics, e.g., CVD dielectrics, and/or semiconductor materials.

The following examples are illustrative of suitable conditions for the practice of the invention and the properties for the resulting glass that are achieved.

EXAMPLE 1

Twenty grams of silicon(IV) acetate was placed in a polyethylene vessel. To this reactant approximately 41.3 mL of n-propanol was added rapidly in one aliquot. (It was found that the desired product was much more reproducibly obtained when the alcohol was added to the acetate rather than employing the inverse procedure.) A magnetic stirrer was employed to furnish agitation during the dissolution process. After dissolution the stirring was terminated. The resulting composition was filtered through a 10 μm pore size poly(tetrafluoroethylene) filter medium. The filter medium was held in a polypropylene filter holder which was, in turn, supported by a poly(tetrafluoroethylene) body. (Nonmetallic and nonglass materials were utilized to avoid contamination.) After this filtration, sequential filtration with a 3 μm and an 0.2 μm filter medium was employed. During each filtration, the filrate was collected in a polyethylene vessel. Positive pressure was supplied with dry nitrogen to furnish an acceptable rate of filtration.

Immediately after collection, the vessel containing the filtrate was stoppered. Twenty-four hours from the time of initial mixing of the reactants, 1 mole equivalent of water was added to the filtrate for every mole of silicon present in the filtrate. This amount was determined by weighing the filtrate and assuming 4 percent of the weighted material was silicon. The resulting composition was mechanically agitated to ensure the production of a homogeneous liquid. The composition was then allowed to stand for an additional 48 hours.

Approximately 0.5 to 1 mL of the resulting sol was placed in the center of a clean, 4-inch silicon wafer having its major surface in the <100> crystallographic plane. The wafer was then, as quickly as possible, accelerated to a rotation speed of 4000 rpm and maintained at this speed for 15 seconds. This spinning was then rapidly terminated. The wafer was subsequently placed for 15 minutes in a convection oven held at 110 degrees Centigrade. The wafer was transferred to a quartz furnace having 1 atmosphere of oxygen and was held for 2 hours at 400 degrees Centigrade. The resulting wafer had a coating of approximately 0.2 μm in thickness and the oxide film had an index of refraction as measured by ellipsometry of approximately 1.42.

EXAMPLE 2

Figure 4:
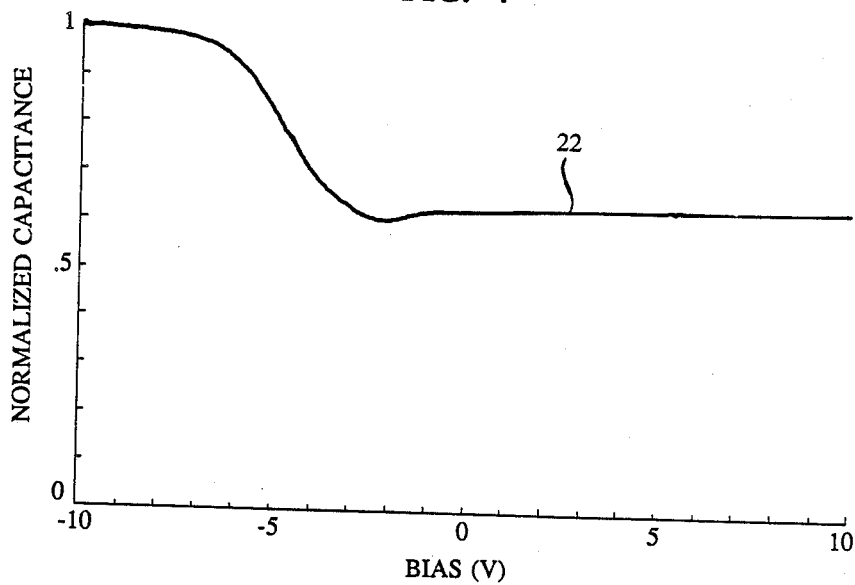

The procedure of Example 1 was followed except the substrate used for spinning included p/p+ epi wafers with 250 Angstroms of gate quality thermal oxide on the surface. The sample was placed in a plasma-enhanced chemical vapor deposition apparatus. The wafer was baked at 400 degrees Centigrade for 20 minutes in vacuum. Approximately 0.2 μm of a plasma-enhanced phosphorous-doped silicon dioxide region was deposited. (This layer had approximately 2 to 3-weight percent phosphorus.) A series of aluminum dots measuring 2 mils in diameter and 0.5 μm thick were deposited onto the composite oxide structure by conventional evaporation techniques. Cyclical voltammograms were taken on the samples and exhibited the properties shown in FIG. 1. The voltammograms were taken at a temperature of 250 degrees Centigrade. Capacitance measurements were taken and are shown in FIG. 4 at 22.

EXAMPLE 3

Figure 3:
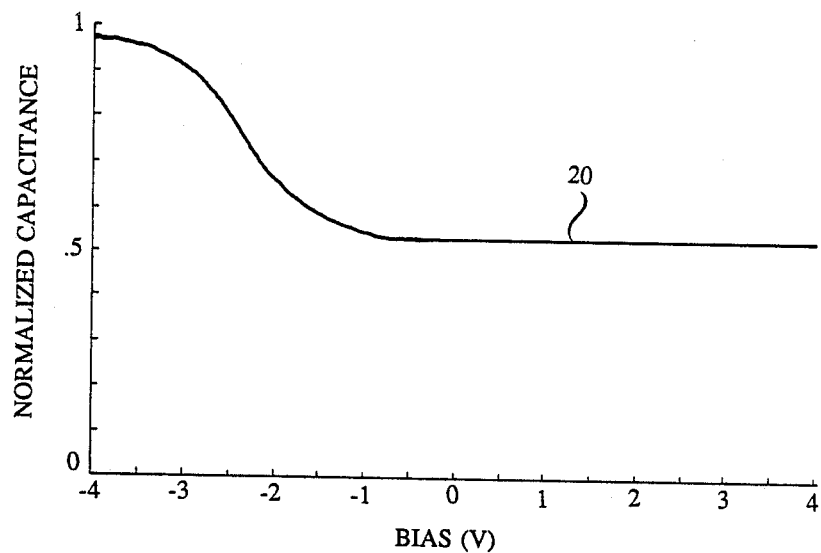

The procedure of Example 1 was followed except that the substrates were p-type, <100>, 7-8 ohm-cm silicon wafers that had been reactive-ion etched to remove 0.5 μm of silicon. After this etching, about 100 Angstroms of sacrificial oxide was thermally grown and chemically removed and then 500 Angstroms of gate oxide was grown at 1000 degrees Centigrade in dry oxygen/hydrogen chloride. After the 400 degree cure in an oxygen atmosphere, the sample was transferred to a 500 degree Centigrade quartz oven having an oxygen atmosphere. The temperature was then increased over a period of approximately half an hour to 900 degrees Centigrade. This temperature was maintained for half an hour and then the sample was removed from the furnace. The index of refraction of the oxide film was 1.43 and the thickness was 0.17 μm. Capacitance measurements were taken as described in Example 10. The results are shown in FIG. 3 at 20.

EXAMPLE 4

The procedure of Example 1 was followed except the silicon substrate had an aluminum pattern of lines and spaces varying between 0.5 and 2μ. The aluminum thickness was different for different samples and ranged between 0.5 and 1 μm. For spacing of 0.5 μm and an aluminum thickness of 0.5,μm, the degree of planarization was 67 percent.

EXAMPLE 5

The procedure of Example 4 was followed except a second layer of spin-on material was deposited and cured by the same procedure as the first. The degree of planarization for a 0.5 μm space and 0.5 μm aluminum thickness was approximately 79 percent.

EXAMPLE 6

The procedure of Example 4 was followed and, additionally, a phosphorus-doped silicon oxide layer having a thickness of approximately 1.5 μm was deposited by the plasma-enhanced procedure described in Example 2 onto the spun-on layer.

EXAMPLE 7

The procedure of Example 5 was followed and, in addition, a 1 μm thick layer of plasma-enhanced phosphorus-doped silicon oxide was deposited as described in Example 2 onto the spun-on layer.

EXAMPLE 8

The procedure of Example 3 was followed except the silicon substrate had trenches that varied between approximately 1 μm wide and between 0.3 and 0.4 μm deep. The surface of the substrate also had a silicon oxide layer approximately 500 Angstroms thick. The substrate was dipped in 100:1 hydrofluoric acid for 30 seconds to clean the substrate and ensure adhesion of the spin-on layer. (Cleaning to ensure adhesion became important for feature depths greater than 0.5 μm.) Three successive layers of spin-on material were applied by the procedure of Example 1 utilizing the 900 degree cure procedure described in Example 3. The resulting surface had a degree of planarization of approximately 73 percent.

This procedure was repeated except the trenches had a depth of approximately 1 μm. To completely fill the bottom of the trench (a trench with a high aspect ratio), the sol utilized for the first spinning was less concentrated than in Example 1 and was prepared by reacting 20 grams of silicon(IV) acetate with 55.1 mL of propanol. The two subsequent layers of spin-on material were prepared as described in Example 1.

EXAMPLE 9

The procedure of Example 1 was followed except after initial inclusion of the acetate approximately 5 mole percent (based on the silicon acetate) of boron oxide, $B_2O_3$, was added to the composition and further stirring was employed for approximately 5 minutes. Additionally, no water was added to the filtrate after filtering and the sol was spun onto the substrate approximately 24 hours after initial dissolution. After a 400 degree Centigrade cure for 2 hours, the index of refraction of the spun-on oxide film was about 1.43 and the thickness was about 0.21 μm. After a 900 degree Centigrade cure the index of refraction was about 1.43 and the thickness was about 0.17 μm.

EXAMPLE 10

The procedure of Example 9 was followed up to and including the filtration step, however, instead of 20 grams of silicon(IV) acetate, 25 grams was employed, and instead of 41.5 mL of n-propanol, 80.8 mL of ethanol was used. Immediately after collection an aliquot of aqueous HF (40 weight percent HF) was added to the filtrate. The amount of aqueous HF added was 0.0014 times the weight of the filtrate. The vessel containing the filtrate and the added HF was then stoppered. The composition was then allowed to stand for 24 hours.

Approximately 0.5 to 1 mL of the resulting sol was placed in the center of a clean, 4-inch silicon wafer having its major surface in the <100> crystallographic plane. The wafer was then, as quickly as possible, accelerated to a rotation speed of 3000 rpm and maintained at this speed for 15 seconds. This spinning was then rapidly terminated. The wafer was subsequently placed for 15 minutes in a convection oven held at 110 degrees Centigrade. The wafer was transferred to a quartz furnace having 1 atmosphere of oxygen and was held for 18 hours at 400 degrees Centigrade. The resulting wafer had a coating of approximately 0.2 μm in thickness and the oxide film had an index of refraction of approximately 1.42.

The number of 1 micron or larger defects per 4-inch wafer, as measured by a Tencor Instruments' Surfscan, was 17. (Scanning electron microscopy, however, indicates the presence of larger defects, possibly associated with dissolved gases.) This is up to approximately an order of magnitude better than that obtained for the procedure of Example 1. Additionally, the etching rate in 30:1 buffered oxide etchant (a conventional aqueous HF etching solution) was approximately 920 Angstroms per minute as compared to 1250 Angstroms per minute for the material obtained in Example 1. The infrared spectrum to the sensitivity of the FTIR spectrum indicated an essentially complete absence of Si—OH stretch absorption.

Figure 2:
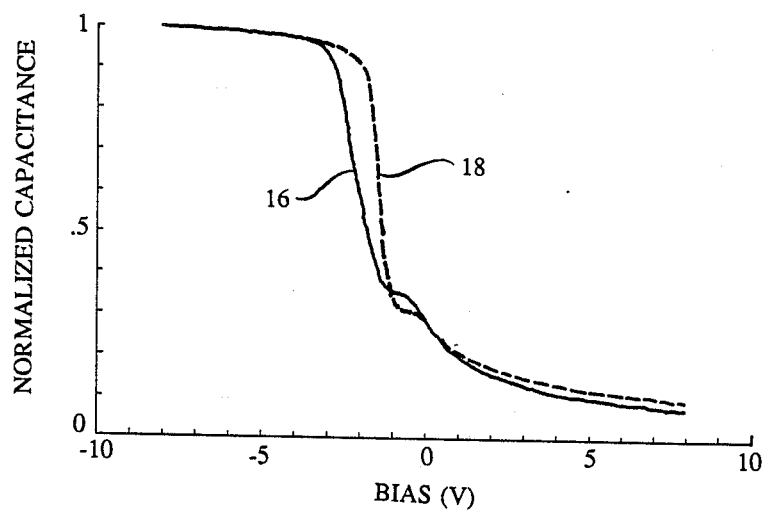

To determine the electrical characteristics, 0.5 μm thick aluminum was deposited on both the back and front surface of the processed wafer. The front surface was then patterned to form the 0.025 $cm^2$ gates of MOS capacitors. After an anneal at 450 degrees Centigrade for 45 minutes in $H_2$, capacitance vs. voltage measurements were then taken and the result is shown in FIG. 2 at 16. This measurement was taken at room temperature.

EXAMPLE 11

The procedure of Example 10 was followed except before filtration an aliquot of $B_2O_3$ was dissolved into the solution with agitation for 5 minutes. This aliquot was equivalent to 0.01342 times the original weight of acetate. No aqueous HF was added to the filtrate. The material was allowed to stand after filtration for 50 hours rather than 24 hours and then the coating procedure of Example 10 was followed. The resulting film had a thickness of approximately 0.19 μm and an index refraction of 1.45. The etching rate of this layer in a 30:1 buffered to oxide etchant was approximately 550 Angstroms per minute. The C-V characteristics are those shown in FIG. 2 at 18.

EXAMPLE 12

The procedure of Example 11 was followed except the HF was, in fact, added.

What is claimed is:

1. A process for producing a device comprising the steps of coating a precursor layer on a non-planar substrate, curing said precursor layer to form a dielectric layer comprising silicon and oxygen and continuing the fabrication of said device characterized in that said precursor layer comprises a material produced by reacting a lower alcohol having at least two carbon atoms with a silicon(IV) anhydride reactant composed of lower organic acid moieties bound to the silicon atom.

2. The process of claim 1 wherein said alcohol comprises a material chosen from the group consisting of ethanol, 1-propanol, and 1-butanol.

3. The process of claim 2 wherein said alcohol comprises ethanol or propanol and wherein $B_2O_3$ is present during said reaction.

4. The process of claim 3 wherein said substrate comprises silicon.

5. The process of claim 2 wherein said coating is done by a step comprising spinning.

6. The process of claim 1 wherein said substrate comprises silicon.

7. The process of claim 2 wherein said alcohol comprises 1-propanol or 1-butanol and wherein water is added during said reaction.

8. The process of claim 1 wherein said coating is done by a step comprising spinning.

9. The process of claim 8 wherein said curing is induced by heating.

10. The process of claim 1 wherein said curing is induced by heating.

11. The process of claim 1 wherein said step of continuing to complete said device comprises depositing a metal layer on said dielectric layer and patterning said metal layer.

12. The process of claim 1 wherein said lower silicon(IV) anhydride comprises an anhydride chosen from the group consisting of silicon(IV) acetate and silicon(IV) propionate.

13. A process for producing a device according to claim 1 characterized in that said precursor layer comprises a material produced by forming salicic acid and controlling the polymerization of said salicic acid such that the polymer yields a scattering pattern to incident 365 nm light that fits with at least a 0.95 correlation coefficient to the theoretical curve predicted for spherical scatterers.

* * * * *